United States Patent
Poon et al.

(10) Patent No.: US 9,547,243 B2
(45) Date of Patent: *Jan. 17, 2017

(54) APPARATUS AND METHOD FOR PROVIDING FLUID FOR IMMERSION LITHOGRAPHY

(71) Applicant: NIKON CORPORATION, Tokyo (JP)

(72) Inventors: Alex Ka Tim Poon, San Ramon, CA (US); Leonard Wai Fung Kho, San Francisco, CA (US)

(73) Assignee: NIKON CORPORATION, Tokyo (JP)

( * ) Notice: Subject to any disclaimer, the term of this patent is extended or adjusted under 35 U.S.C. 154(b) by 165 days.

This patent is subject to a terminal disclaimer.

(21) Appl. No.: 14/519,573

(22) Filed: Oct. 21, 2014

(65) Prior Publication Data

US 2015/0036113 A1    Feb. 5, 2015

Related U.S. Application Data (60) Division of application No. 13/944,281, filed on Jul. 17, 2013, now Pat. No. 8,896,807, which is a division
(Continued)

(51) Int. Cl.
*G03B 27/42* (2006.01)
*G03F 7/20* (2006.01)

(52) U.S. Cl.
CPC .......... *G03F 7/70341* (2013.01); *G03F 7/708* (2013.01); *G03F 7/70358* (2013.01)

(58) Field of Classification Search
CPC ... G03F 7/70341; G03F 7/70358; G03F 7/708
(Continued)

(56) References Cited

U.S. PATENT DOCUMENTS

| 3,648,587 A | 3/1972 | Stevens |
| 4,346,164 A | 8/1982 | Tabarelli et al. |

(Continued)

FOREIGN PATENT DOCUMENTS

| CN | 1501173 A | 6/2004 |
| DE | 221 563 A1 | 4/1985 |

(Continued)

OTHER PUBLICATIONS

Dec. 1, 2015 Search Report issued in European Application No. 15158998.3.

(Continued)

*Primary Examiner* — Peter B Kim
(74) *Attorney, Agent, or Firm* — Oliff PLC (57) ABSTRACT

An immersion lithography system and method exposes a substrate through a liquid. The substrate is exposed through the liquid, which is provided between a final optical element of a projection lens and the substrate. The liquid is recovered from an upper surface of the substrate via a recovery opening of an immersion apparatus under which the substrate is positioned, the immersion apparatus being disposed around the final optical element of the projection lens. The a pressure for recovering the liquid from the upper surface of the substrate via the recovery opening is controlled by a pressure control system, the pressure control system having a first tank connected to the recovery opening via a recovery flow line and a vacuum regulator to control a pressure in the first tank.

31 Claims, 7 Drawing Sheets

Related U.S. Application Data of application No. 12/461,243, filed on Aug. 5, 2009, now Pat. No. 8,520,187, which is a continuation of application No. 11/790,233, filed on Apr. 24, 2007, now abandoned, which is a division of application No. 11/362,833, filed on Feb. 28, 2006, now Pat. No. 7,292,313, which is a continuation of application No. PCT/US2004/022915, filed on Jul. 16, 2004.

(60) Provisional application No. 60/500,312, filed on Sep. 3, 2003, provisional application No. 60/541,329, filed on Feb. 2, 2004.

(58) Field of Classification Search
USPC .................. 355/30, 53, 67, 71; 378/34, 35
See application file for complete search history.

(56) References Cited

U.S. PATENT DOCUMENTS

| | | |
|---|---|---|
| 4,480,910 A | 11/1984 | Takanashi et al. |
| 4,509,852 A | 4/1985 | Tabarelli et al. |
| 5,610,683 A | 3/1997 | Takahashi |
| 5,715,039 A | 2/1998 | Fukuda et al. |
| 5,825,043 A | 10/1998 | Suwa |
| 6,262,796 B1 | 7/2001 | Loopstra et al. |
| 6,341,007 B1 | 1/2002 | Nishi et al. |
| 7,053,983 B2 | 5/2006 | Tokita |
| 7,119,874 B2 | 10/2006 | Cox et al. |
| 7,292,313 B2 | 11/2007 | Poon et al. |
| 7,367,345 B1 | 5/2008 | Hemker et al. |
| 7,388,648 B2 | 6/2008 | Lof et al. |
| 7,576,833 B2 | 8/2009 | Poon et al. |
| 8,520,187 B2 | 8/2013 | Poon et al. |
| 2002/0163629 A1 | 11/2002 | Switkes et al. |
| 2002/0191166 A1 | 12/2002 | Hasegawa et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0060195 A1 | 4/2004 | Garcia et al. |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0182422 A1 | 9/2004 | Boyd et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264778 A1 | 12/2005 | Lof et al. |
| 2005/0270505 A1 | 12/2005 | Smith |
| 2005/0280791 A1 | 12/2005 | Nagasaka et al. |
| 2005/0282405 A1 | 12/2005 | Harpham et al. |
| 2006/0023183 A1 | 2/2006 | Novak et al. |
| 2006/0023188 A1 | 2/2006 | Hara |
| 2006/0038968 A1 | 2/2006 | Kemper et al. |
| 2006/0061739 A1 | 3/2006 | Hoogendam et al. |
| 2006/0087630 A1 | 4/2006 | Kemper et al. |
| 2006/0119818 A1 | 6/2006 | Nagasaka |
| 2006/0139593 A1 | 6/2006 | Nagasaka et al. |
| 2006/0152697 A1 | 7/2006 | Poon et al. |
| 2006/0158627 A1 | 7/2006 | Kemper et al. |
| 2006/0176456 A1 | 8/2006 | Nagasaka et al. |
| 2006/0209278 A1 | 9/2006 | Kiuchi et al. |
| 2006/0209414 A1 | 9/2006 | Van Santen et al. |
| 2006/0261288 A1 | 11/2006 | Van Santen |
| 2007/0110213 A1 | 5/2007 | Leenders et al. |
| 2007/0222967 A1 | 9/2007 | Poon et al. |

(56) References Cited

U.S. PATENT DOCUMENTS

| | | |
|---|---|---|
| 2008/0291409 A1 | 11/2008 | Nakano |
| 2009/0002648 A1 | 1/2009 | Poon et al. |

FOREIGN PATENT DOCUMENTS

| | | |
|---|---|---|
| DE | 224 448 A1 | 7/1985 |
| EP | 0 605 103 A1 | 7/1994 |
| EP | 1 420 298 A2 | 5/2004 |
| EP | 1 477 856 A1 | 11/2004 |
| EP | 1 486 827 A2 | 12/2004 |
| EP | 1 489 462 A2 | 12/2004 |
| EP | 1498778 A1 | 1/2005 |
| EP | 1 571 697 A1 | 9/2005 |
| EP | 1 598 855 A1 | 11/2005 |
| EP | 1 612 850 A1 | 1/2006 |
| EP | 1646074 A1 | 4/2006 |
| EP | 1646075 A1 | 4/2006 |
| EP | 1662554 A1 | 5/2006 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-58436 | 2/2000 |
| JP | A-2004-289126 | 10/2004 |
| JP | A-2004-320016 | 11/2004 |
| JP | A-2004-349645 | 12/2004 |
| JP | A-2005-12228 | 1/2005 |
| JP | A-2005-19864 | 1/2005 |
| JP | WO-A-2005/006415 | 1/2005 |
| JP | WO-A-2005/006417 | 1/2005 |
| JP | A-2005-045082 | 2/2005 |
| JP | A-2005-045223 | 2/2005 |
| JP | A-2005-045232 | 2/2005 |
| JP | WO-A-2005/020299 | 3/2005 |
| JP | A-2005-109426 | 4/2005 |
| JP | A-2006-510146 | 3/2006 |
| JP | A-2006-511021 | 3/2006 |
| JP | A-2006-523029 | 10/2006 |
| JP | A-2007-525007 | 8/2007 |
| TW | 200502719 A | 1/2005 |
| TW | 200507049 A | 2/2005 |
| WO | WO 99/49504 | 9/1999 |
| WO | WO 00/20940 | 4/2000 |
| WO | WO 02/091078 A1 | 11/2002 |
| WO | WO 03/077037 A1 | 9/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/086468 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/006418 A1 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Apr. 3, 2015 Office Action issued in U.S. Appl. No. 13/137,964.
Aug. 24, 2015 Advisory Action issued in U.S. Appl. No. 13/137,964.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, $3^{rd}$ 157 nm symposium, Sep. 4, 2002, "Nikon F2 Exposure Tool", Soichi Owa et al., 25 pages. (slides 1-25).
Nikon Corporation, Immersion Lithography Workshop, Dec. 11, 2002, 24 pages. (slides 1-24).
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages. (slides 1-38).
Nikon Corporation, Litho Forum, Jan. 28, 2004, "Update on 193 nm immersion exposure tool", S. Owa et al., 51 pages. (slides 1-51).
Nikon Corporation, NGL Workshop, Jul. 10, 2003, :Potential performance and feasibility of immersion lithography, Soichi Owa et al., 33 pages, slides 1-33.
Refractron Technologies Corp. Product Literature: Porous Ceramics and Specifications, www.refractron.com/display/default.aspx?CategoryID=22.
Oct. 11, 2006 Office Action in U.S. Appl. No. 11/362,833.
Jun. 22, 2007 Notice of Allowance in U.S. Appl. No. 11/362,833.
Feb. 5, 2009 Office Action in U.S. Appl. No. 11/790,233.

(56) References Cited

OTHER PUBLICATIONS

May 13, 2009 Office Action in U.S. Appl. No. 11/579,442.
Nov. 10, 2009 Office Action in U.S. Appl. No. 11/579,442.
Apr. 7, 2009 Notice of Allowance in U.S. Appl. No. 11/987,788.
Sep. 17, 2008 Office Action in U.S. Appl. No. 11/987,788.
Jul. 22, 2008 Office Action in Japanese Application No. 2006-525323, with translation.
Mar. 3, 2009 Notice of Allowance in Japanese Application No. 2006-525323, with translation.
Apr. 27, 2007 Office Action in Chinese Application No. 2004800238885, with translation.
Feb. 1, 2008 Notice of Allowance in Chinese Application No. 2004800238885, with translation.
Feb. 24, 2010 Office Action in Chinese Application No. 200810092257.9, with translation.
Aug. 15, 2005 Written Opinion in International Application No. PCT/US04/22915.
Jan. 22, 2008 Office Action in European Application No. 05741209.0.
Mar. 20, 2006 Written Opinion in International Application No. PCT/US2005/014200.
Sep. 15, 2008 Supplemental European Search Report in European Application No. 04778426.9.
Aug. 15, 2005 International Search Report in International Application No. PCT/US04/22915.
Mar. 20, 2006 International Search Report in International Application No. PCT/US2005/014200.
Feb. 4, 2011 Office Action in U.S. Appl. No. 11/579,442.
Jun. 14, 2011 Office Action issued in JP Application No. 2008-242895 (with English translation).
Jun. 15, 2011 Office Action issued in TW Application No. 093126654 (with English translation).
Jun. 21, 2011 Notice of Allowance issued in U.S. Appl. No. 11/579,442.
Sep. 20, 2011 Office Action issued in JP Application No. 2008-242895 (with English translation).
Dec. 28, 2012 Office Action issued in Korean Application No. 2011-7024246 (with English translation).
Mar. 5, 2013 Office Action issued in Japanese Patent Application No. 2010-255404 (with translation).
Mar. 19, 2013 Office Action issued in European Patent Application No. 04778426.9.
Mar. 18, 2013 Office Action issued in European Patent Application No. 05741209.0.
Aug. 27, 2010 Office Action issued in U.S. Appl. No. 12/461,243.
May 12, 2011 Office Action issued in U.S. Appl. No. 12/461,243.
Jan. 4, 2013 Office Action issued in U.S. Appl. No. 12/461,243.
Apr. 29, 2013 Notice of Allowance issued in U.S. Appl. No. 12/461,243.
Jul. 9, 2013 Office Action issued in Japanese Application No. 2012-015910 (with translation).
Apr. 22, 2014 Office Action issued in Taiwanese Patent Application No. 100146764 (with translation).
Aug. 5, 2014 Office Action issued in U.S. Appl. No. 13/137,964.
Sep. 2, 2014 Office Action issued in Japanese Patent Application No. 2013-186437 (with translation).
Sep. 24, 2013 Office Action issued in U.S. Appl. No. 13/944,281.
Mar. 4, 2014 Office Action issued in U.S. Appl. No. 13/944,281.
Jul. 21, 2014 Notice of Allowance issued in U.S. Appl. No. 13/944,281.
Jul. 25, 2016 Office Action issued in Korean Patent Application No. 10-2014-7029538.

APPARATUS AND METHOD FOR PROVIDING FLUID FOR IMMERSION LITHOGRAPHY

CROSS-REFERENCES TO RELATED APPLICATIONS

This is a divisional of U.S. patent application Ser. No. 13/944,281 filed Jul. 17, 2013 (now U.S. Pat. No. 8,896, 807), which in turn is a divisional of U.S. patent application Ser. No. 12/461,243 filed Aug. 5, 2009 (now U.S. Pat. No. 8,520,187), which is a continuation of U.S. patent application Ser. No. 11/790,233 filed Apr. 24, 2007 (now abandoned), which is a divisional of U.S. patent application Ser. No. 11/362,833 filed Feb. 28, 2006 (now U.S. Pat. No. 7,292,313), which is a continuation of International Application No. PCT/US2004/022915 filed Jul. 16, 2004, which claims the benefit of U.S. Provisional Patent Application No. 60/500,312 filed Sep. 3, 2003, and U.S. Provisional Patent Application No. 60/541,329 filed Feb. 2, 2004. The disclosures of these applications are incorporated herein by reference in their entireties.

BACKGROUND

The invention relates generally to systems and methods for providing fluid for immersion lithography and, more particularly, for controlling the fluid flow and pressure to provide stable conditions for immersion lithography.

An exposure apparatus is one type of precision assembly that is commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, a measurement system, and a control system. The resist coated wafer is placed in the path of the radiation emanating from a patterned mask and exposed by the radiation. When the resist is developed, the mask pattern is transferred onto the wafer. In microscopy, extreme ultraviolet (EUV) radiation is transmitted through a thin specimen to a resist covered plate. When the resist is developed, a topographic shape relating to the specimen structure is left.

Immersion lithography is a technique that can enhance the resolution of projection lithography by permitting exposures with a numerical aperture (NA) greater than one, which is the theoretical maximum for conventional "dry" systems. By filling the space between the final optical element and the resist-coated target (i.e., wafer), immersion lithography permits exposure with light that would otherwise be totally internally reflected at an optic-air interface. Numerical apertures as high as the index of the immersion liquid (or of the resist or lens material, whichever is least) are possible. Liquid immersion also increases the wafer depth of focus, i.e., the tolerable error in the vertical position of the wafer, by the index of the immersion liquid compared to a dry system with the same numerical aperture. Immersion lithography thus has the potential to provide resolution enhancement equivalent to the shift from 248 to 193 nm. Unlike a shift in the exposure wavelength, however, the adoption of immersion would not require the development of new light sources, optical materials, or coatings, and should allow the use of the same or similar resists as conventional lithography at the same wavelength. In an immersion system where only the final optical element and its housing and the wafer (and perhaps the stage as well) are in contact with the immersion fluid, much of the technology and design developed for conventional tools in areas such as contamination control, carry over directly to immersion lithography.

One of the challenges of immersion lithography is to design a system for delivery and recovery of a fluid, such as water, between the final optical element and the wafer, so as to provide a stable condition for immersion lithography.

SUMMARY

Embodiments of the invention are directed to systems and methods of controlling the fluid flow and pressure to provide stable conditions for immersion lithography. A fluid is provided in a space between the lens and the substrate during the immersion lithography process. Fluid is supplied to the space and is recovered from the space through a porous member in fluidic communication with the space. Maintaining the pressure in the porous member under the bubble point of the porous member can eliminate noise created by mixing air with the fluid during fluid recovery. The bubble point is a characteristic of the porous member that depends on the size of the holes in the porous member (the largest hole) and the contact angle that the fluid forms with the porous member (as a parameter based on the property of the porous material and the property of the fluid). Because the bubble point is typically a very low pressure, the control of this low pressure becomes an important issue.

An aspect of the invention is directed to a method of recovering a fluid from a space between a lens and a substrate in an immersion lithography system. The method includes drawing the fluid from the space via a recovery flow line through a porous member and maintaining a pressure of the fluid in the porous member below a bubble point of the porous member during drawing of the fluid from the space.

In some embodiments, maintaining the pressure is accomplished by providing an overflow container kept at a preset pressure and directing the fluid drawn from the space through the porous member via the recovery flow line to the overflow container. Maintaining the pressure can further include siphoning the fluid from the overflow container to a collection tank. The fluid is siphoned down by gravity to the collection tank disposed below the overflow container. In other embodiments, maintaining the pressure includes providing a fluid level buffer, drawing the fluid from the space via a buffer flow line through the porous member to the fluid level buffer, sensing a pressure or a fluid level at the fluid level buffer, and controlling the fluid flow drawn from the space via the recovery flow line through the porous member based on the sensed pressure or fluid level at the fluid level buffer. Controlling the fluid flow can include controlling a variable valve disposed in the recovery flow line downstream of the porous member. In still other embodiments, maintaining the pressure includes providing a fluid level buffer, drawing the fluid from the space via a buffer flow line through the porous member to the fluid level buffer, sensing a pressure or a fluid level at the fluid level buffer, and controlling a vacuum pressure at an outlet of the recovery flow line through the porous member based on the sensed pressure or fluid level at the fluid level buffer. Controlling the vacuum pressure can include controlling a vacuum regulator in a collection tank at the outlet of the recovery flow line.

In accordance with another aspect of the invention, an apparatus for recovering a fluid from a space between a lens and a substrate in an immersion lithography system includes an inner part that includes a lens opening to accommodate a portion of the lens and to position the lens apart from the substrate separated by the space to receive a fluid in the space between the lens and the substrate. An outer part is disposed around the inner part, and includes a porous member fluidically coupled with the space and with a fluid recovery outlet to draw fluid from the space via the porous member to the fluid recovery outlet. A pressure control system is fluidically coupled with the porous member to maintain a pressure at the surface of the porous member below a bubble point of the porous member during drawing of the fluid from the space via the porous member.

In some embodiments, the pressure control system includes an overflow container fluidically coupled with the porous member and a vacuum regulator that regulates a pressure in the overflow container. A collection tank is fluidically coupled to and disposed below the overflow container. In other embodiments, the pressure control system includes a fluid level buffer fluidically coupled with the porous member, a sensor that senses a pressure or a fluid level at the fluid level buffer and a controller that adjusts a flow rate of the fluid drawn from the space through the fluid recovery outlet, based on a sensor signal output from the sensor, to maintain a pressure at the surface of the porous member below a bubble point of the porous member during drawing of the fluid from the space via the porous member. The pressure control system can include a valve disposed downstream of the fluid recovery outlet, and the controller controls the valve to adjust the flow rate of the fluid drawn from the space through the fluid recovery outlet. In still other embodiments, the pressure control system includes a collection tank fluidically coupled to the fluid recovery outlet and a controllable vacuum regulator that regulates a pressure in the collection tank. The controller controls the controllable vacuum regulator to adjust the flow rate of the fluid drawn from the space through the fluid recovery outlet to the collection tank by controlling the pressure in the collection tank.

In specific embodiments, the inner part is spaced from the outer part by an intermediate spacing. The inner part includes an inner cavity forming a part of the spacing between the lens and the substrate, and the inner part includes apertures disposed above the inner cavity for at least one of introducing fluid into and drawing fluid from the inner cavity. The inner part includes apertures disposed on opposite sides of the lens opening for introducing fluid into the inner cavity. The inner part includes a pair of buffer slots disposed on opposite sides of the lens opening in a direction of scan of the immersion lithography system. The inner part includes purge holes and each of the pair of buffer slots is fluidically coupled to at least one of the purge holes. The porous member is selected from the group consisting of a mesh, a porous material, and a member having etched holes therein.

In accordance with another aspect of the invention, an apparatus includes an optical projection system having a last optical element and that projects an image onto a workpiece, and a stage that supports the workpiece adjacent to the optical projection system when the image is being projected onto the workpiece. A gap is provided between the last optical element and the workpiece and is filled with an immersion fluid. A porous material is positioned adjacent to the gap and recovers fluid exiting the gap. A control system maintains a pressure on the porous material. The pressure is at or below the bubble point of the porous material.

BRIEF DESCRIPTION OF THE DRAWINGS

The invention will be described in conjunction with the accompanying drawings of exemplary embodiments in which like reference numerals designate like elements and in which.

DETAILED DESCRIPTION OF EMBODIMENTS

Figure 1:
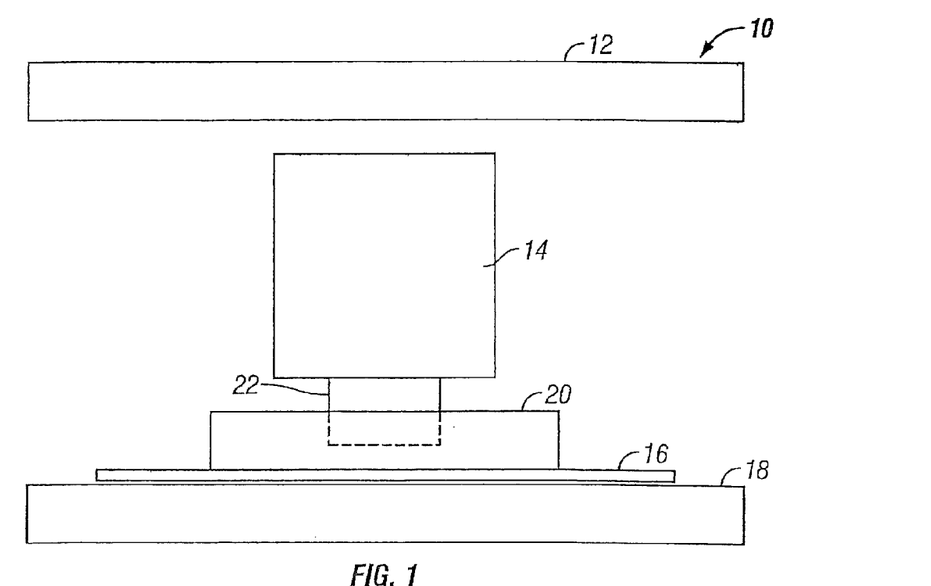
FIG. 1 is a simplified elevational view schematically illustrating an immersion lithography system according to an embodiment of the invention.

FIG. 1 shows an immersion lithography system 10 including a reticle stage 12 on which a reticle is supported, a projection lens 14, and a wafer 16 supported on a wafer stage 18. An immersion apparatus 20, which is sometimes referred to herein as a showerhead or a nozzle, is disposed around the final optical element 22 of the projection lens 14 to provide and recover a fluid, which may be a liquid such as water or a gas, between the final optical element 22 and the wafer 16. In the present embodiment, the immersion lithography system 10 is a scanning lithography system in which the reticle and the wafer 16 are moved synchronously in respective scanning directions during a scanning exposure.

Figure 2:
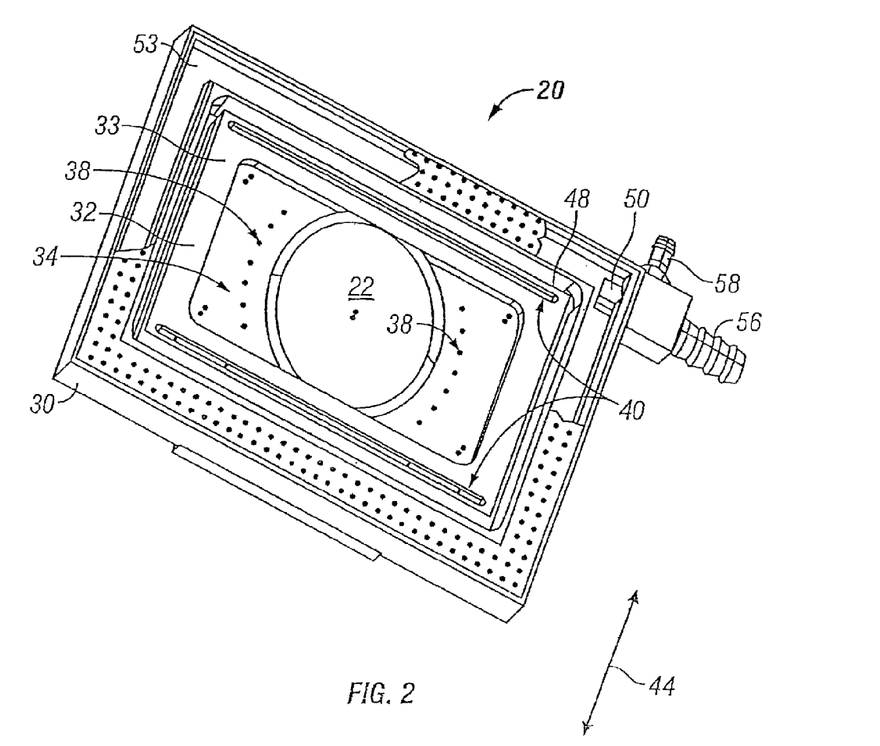
FIG. 2 is a perspective view of a nozzle for fluid delivery and recovery for immersion lithography according to one embodiment of the invention.
Figure 3:
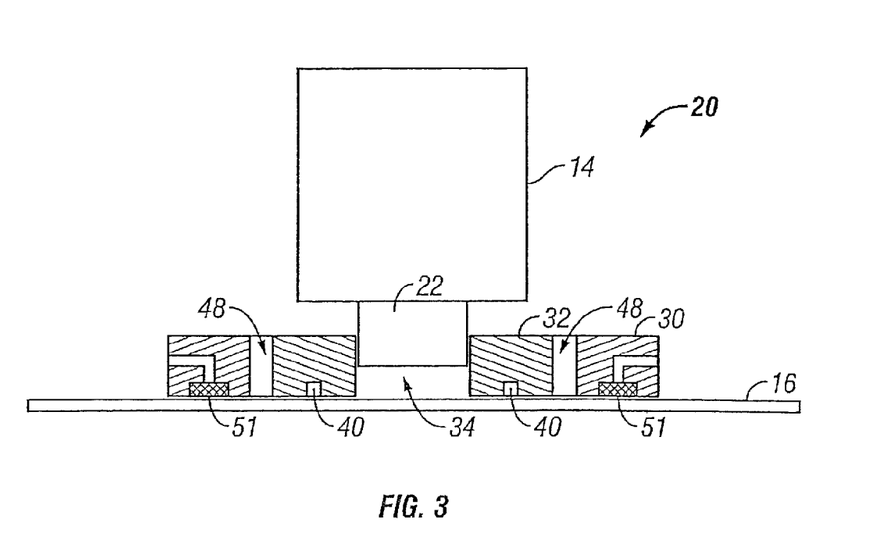
FIG. 3 is a simplified cross-sectional view of the nozzle of FIG. 2.
Figure 4:
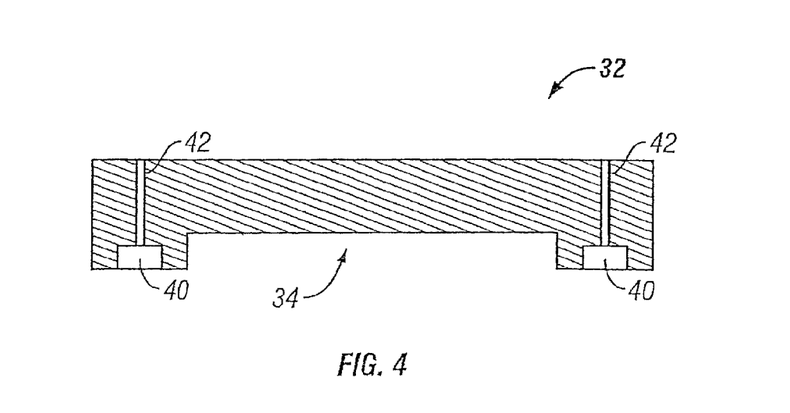
FIG. 4 is a cross-sectional view of the inner part of the nozzle of FIG. 2.

FIGS. 2 and 3 show the apparatus or nozzle 20 for delivery and recovery of the fluid between the final optical element 22 and the wafer 16 for immersion lithography. FIG. 2 shows the bottom perspective view of the nozzle 20, which includes an outer part 30 and an inner part 32. The inner part 32 defines an inner cavity 34 to receive the fluid between the final optical element 22 and the wafer 16. The inner part 32 includes apertures 38 for fluid flow into and out of the inner cavity 34. As seen in FIG. 2, there are apertures 38 disposed on both sides of the final optical element 22. The inner part 32 has a flat portion 33 surrounding the inner cavity 34. The flat portion 33 is substantially parallel to the wafer 16. The distance D1 between the end surface of the final optical element 22 and the wafer 16 is greater than the distance D2 between the flat portion 33 and the wafer 16. The distance D1 could be 1.0-5.0 mm, and the distance D2 could be 0.5-2.0 mm. In another embodiment, the distance D1 is substantially equal to the distance D2. The inner part 32 further includes a pair of buffers or buffer slots 40 with purge holes 42 (see FIG. 4). The buffers 40 are arranged at or near the flat portion 33. The buffers 40 are disposed on opposite sides of the final optical element 22. A cross-sectional view of the inner part 32 in the direction of scan 44 is illustrated in FIG. 4.

Figure 5:
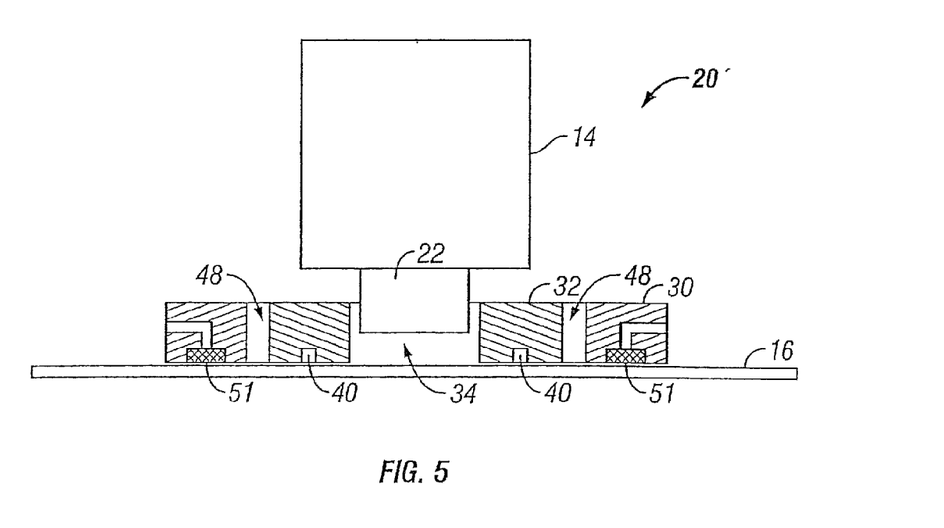
FIG. 5 is a simplified cross-sectional view of the nozzle according to another embodiment.

The outer part 30 is spaced from the inner part 32 by an intermediate spacing or groove 48, which may be referred to as an atmospheric groove. The outer part 30 includes one or more fluid recovery openings 50 disposed on opposite sides of the final optical element 22. A porous member 51 is disposed in a slot or outer cavity 53 that extends around the inner part 32 and fluidicly communicates with the pair of fluid recovery openings 50. The porous member 51 may be a mesh or may be formed of a porous material having holes typically in the size range of about 50-200 microns. For example, the porous member 51 may be a wire mesh including woven pieces or layers of material made of metal, plastic, or the like, a porous metal, a porous glass, a porous plastic, a porous ceramic, or a sheet of material having chemically etched holes (e.g., by photo-etching). The porous member 51 is desirably hydrophilic. The outer part 30 further includes a fluid buffer outlet 56 and a fluid recovery outlet 58. In another embodiment of the nozzle 20' as seen in FIG. 5, the inner part 32 does not contact or form a seal with the final optical element 22, but is spaced from the final optical element 22. The gap prevents nozzle vibrations from being transmitted to the final optical element 22. However, the gap may allow the fluid to be exposed to air.

One feature of the nozzle 20 is that it is made in two pieces, namely, the outer part 30 and the inner part 32. The inner part 32 keeps the fluid between the lens and the wafer surface, and the outer part 30 is mainly provided for fluid recovery. Vibration might be introduced during fluid recovery from the outer part 30 through the porous member 51 to the other components of the lithography system, including the inner part 32 which may be used to direct an autofocus beam to the wafer 16. A damping material can be mounted between the outer part 30 and the mounting piece to which the outer part 30 is mounted to minimize the transmission of vibration from the outer part 30. In addition, the outer part 30 that includes the porous member may be prone to contamination and thus needs to be replaced for maintenance. Making the outer part 30 as a separate part facilitates easier maintenance. It can also minimize readjustment and recalibration time after replacement of the outer part as opposed to replacing the entire nozzle 20. Manufacturability of the nozzle 20 can also be improved if the nozzle 20 is made in two separate parts. It is understood that the nozzle 20 may be made of a single piece in alternative embodiments.

Another feature of the nozzle 20 is the atmospheric groove 48 between the inner part 32 and the outer part 30. This atmospheric groove 48 functions as a breaking edge to prevent fluid in the inner part 32 from being drawn out by the porous member 51 on the outer part 30 if the fluid recovery rate is faster than the fluid supply rate. In the situation when there is no breaking edge, a balance between the fluid recovery rate and the fluid supply rate has to be maintained so that fluid can be kept within the inner part 32 at all times during scanning. Having the atmospheric groove 48 allows the recovery rate to be set at a maximum to minimize fluid leakage out of the outer part 30 during scanning. The atmospheric groove 48 also acts as a buffer for fluid to go in and out during scanning, minimizing water supply and recovery requirements.

In the process of immersion lithography, a fluid is to be filled between the projection lens 14 and the wafer 16 from a dry state and, at other times, the fluid is to be recovered. For example, in the beginning of exposure of a new wafer, the fluid is to completely fill the inner cavity 34 of the inner part 32 before starting exposure. During this process, ideally no air bubbles can exist between the projection lens 14 and wafer 16 or other optical paths such as the auto focus beam.

The fluid supply in the inner cavity of the inner part 32 is designed to be at the highest point in the cavity (via apertures 38) so that the fluid is filled from top down, allowing air bubbles to be pushed out of the inner cavity during the filling process. The fluid desirably is initially supplied from one side in this embodiment (the set of apertures 38 on one side), so that the fluid is filled from one side to the other, again allowing air bubbles to be pushed out to avoid trapping air therein. Other arrangements are also possible, as long as the fluid is being filled from the inside out.

On occasion, the fluid has to be fully recovered from the inner cavity of the inner part 32. In FIG. 4, there are small holes 42 in each of the buffers 40 in the inner cavity. These holes 42 are provided for fast fluid recovery or fluid purge when the fluid has to be fully recovered. Sucking the fluid out from these holes 42 using high vacuum with the combination of some movement in the wafer stage 18 allows all the fluid to be recovered within a reasonable time.

The inner part 32 has two groups or rows of holes 38 for supplying or recovering the fluid. Each row can be independently controlled to either supply or recover the fluid. In the case where both rows are chosen for fluid supply, all the fluid is recovered through the porous member 51 in the outer part 30. Because both rows are supplying fluid, a pressure can build up in the inner cavity causing deformation of the final optical element 22 of the projection lens 14 or the wafer 16 or both. The fluid flow across the final optical element 22 may also be limited, and thus the temperature of the fluid between the final optical element 22 and the wafer 16 may eventually rise, causing adverse effects. On the other hand, if one row is chosen for supply and the other for recovery, a fluid flow will be driven across the final optical element 22, minimizing temperature rise. It can also reduce the pressure otherwise created by supplying fluid from both rows. In this case, less fluid needs to be recovered through the porous member 51, lowering the fluid recovery requirement in the porous member. In other nozzle configurations, multiple fluid supplies and recoveries may be provided so as to optimize the performance.

During scanning motion of the wafer stage 18 (in the direction of scan 44 in FIG. 2), the fluid may be dragged in and out of the inner cavity of the inner part 32. When the fluid is dragged out, it is recovered through the porous member 51 in the outer part 30. When the wafer stage 18 is moved in the opposite direction, air may be dragged into the inner cavity of the inner part 32. During this time, the fluid in the buffers 40, as well as the fluid supplied from within the inner cavity, helps to refill the fluid that is dragged along the scanning direction, preventing air from getting into the inner cavity. The buffers 40 and the porous member 51 work together to minimize fluid leaking out from the outer part 30, and air dragging into the inner cavity of the inner part 32 during scanning motion of the wafer stage 18.

Figure 6:
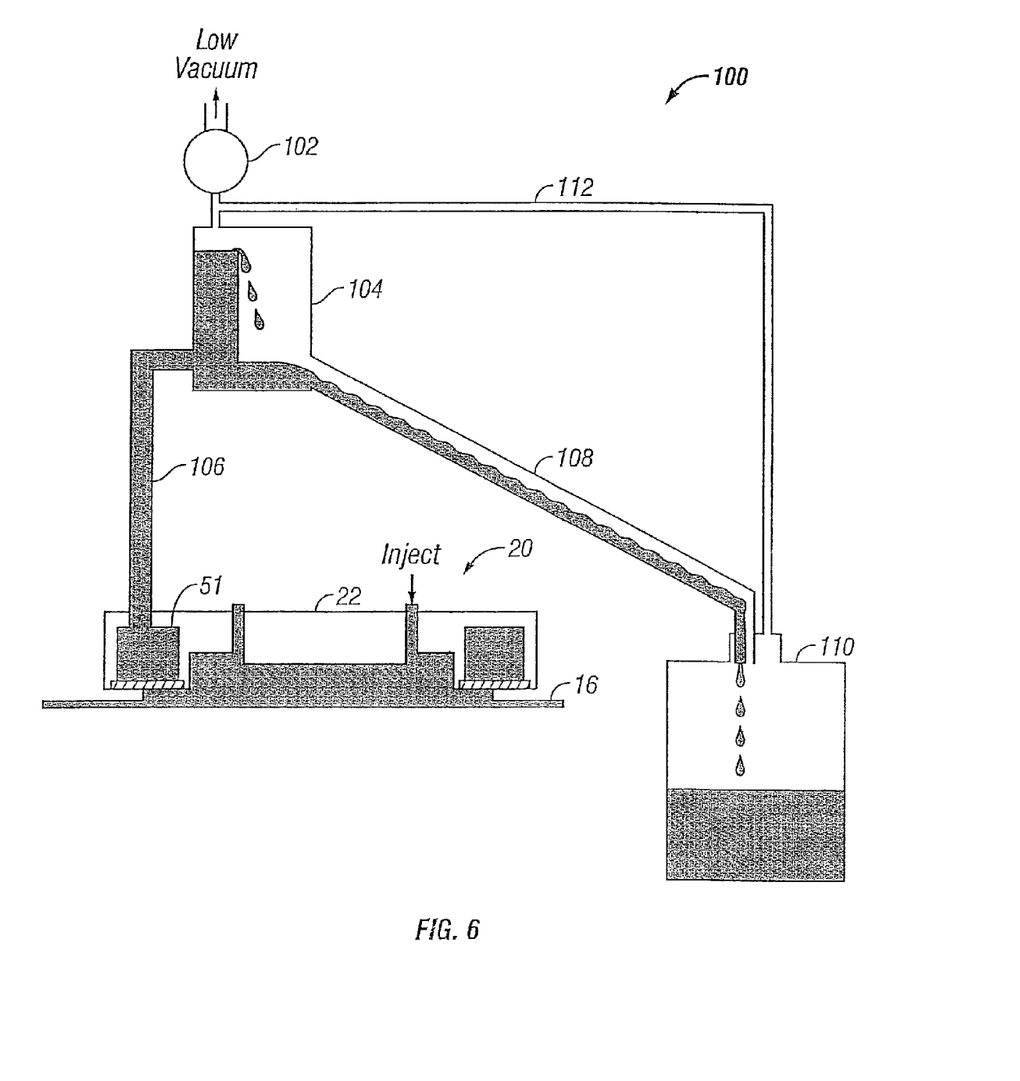
FIG. 6 is a simplified view schematically illustrating a pressure control system for fluid recovery in an immersion lithography system according to one embodiment of the invention.
Figure 7:
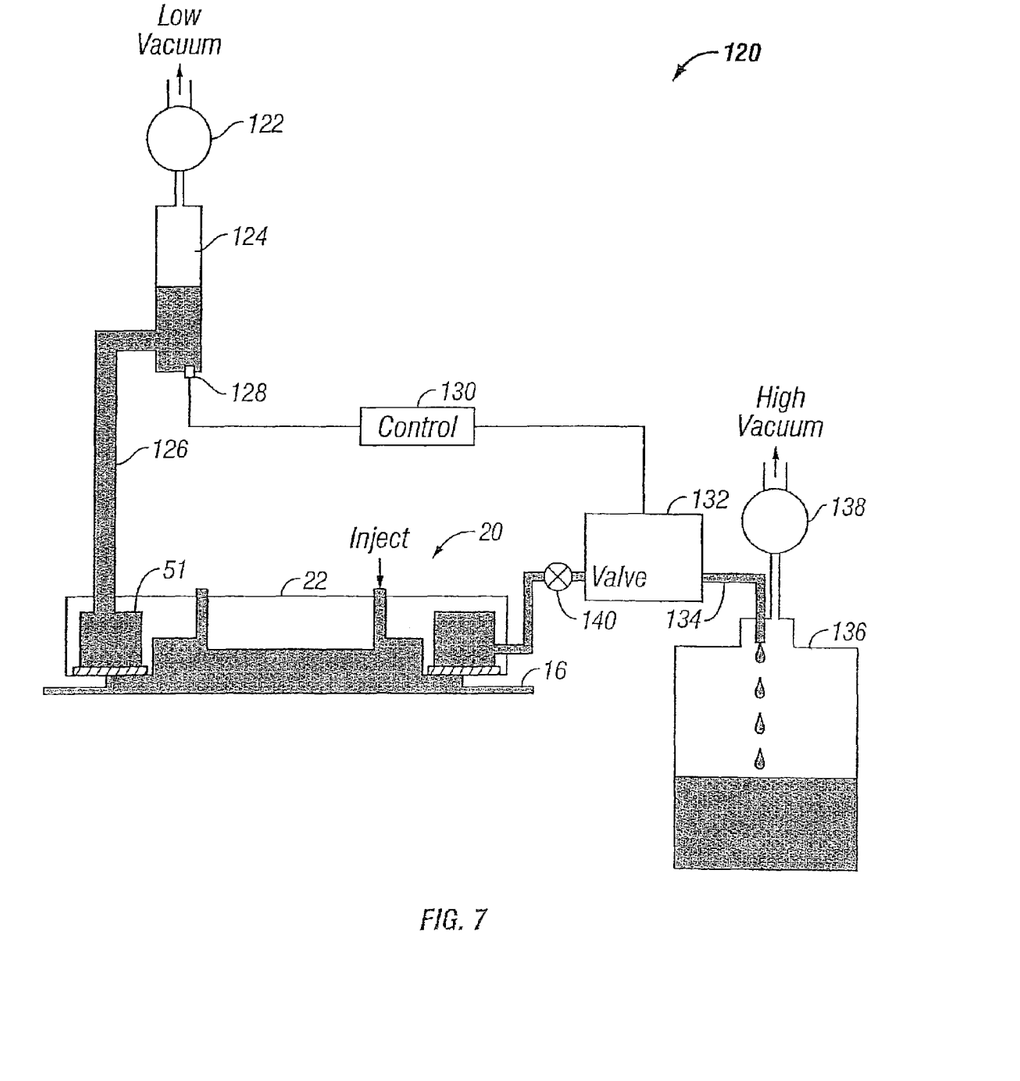
FIG. 7 is a simplified view schematically illustrating a pressure control system for fluid recovery in an immersion lithography system according to another embodiment of the invention.

Recovering fluid through the porous member 51 by maintaining the pressure in the porous member 51 under the bubble point can eliminate noise created by mixing air with the fluid during fluid recovery. The bubble point is a characteristic of the porous member 51 that depends on the size of the holes in the porous member 51 (the largest hole) and the contact angle that the fluid forms with the porous member 51 (as a parameter based on the property of the porous material and the property of the fluid). Due to the fact that the bubble point is typically a very low pressure (e.g., about 1000 pascal), the control of this low pressure becomes an important issue. FIGS. 6-7 illustrate three specific ways of maintaining the pressure below the bubble point during fluid recovery.

In the pressure control system 100 of FIG. 6, a pressure under bubble point is maintained at the surface of the porous member 51 using a vacuum regulator 102 with the assistance of an overflow container or tank 104 fluidicly coupled to the porous member 51 by a recovery flow line 106 (which is connected to the fluid buffer outlet 56). The pressure at the surface of the porous member 51 is equal to the pressure maintained by the vacuum regulator 102 subtracting the pressure created by the height of the fluid above the porous member 51. Maintaining a constant height of fluid above the porous member 51 using the overflow tank 104 allows easy control of the pressure at the surface of the porous member 51. The fluid that is recovered through the porous member 51 will overflow and be siphoned down along a siphon line 108 to a collection tank 110, which is disposed below the overflow tank 104. An optional flow path 112 is connected between the overflow tank 104 and the collection tank 110 to assist in equalizing the pressure between the overflow tank 104 and the collection tank 110 and facilitate flow along the siphon line 108. One feature of this pressure control system 100 is that it is a passive system without the necessity of control.

In the pressure control system 120 of FIG. 7, the pressure at the surface of the porous member 51 is maintained below the bubble point using a vacuum regulator 122 at a fluid level buffer 124 which is fluidically coupled with the porous member 51 by a buffer flow line 126 (which is connected to the fluid buffer outlet 56). A pressure transducer or a water level sensor 128 is used to measure the pressure or fluid level at the fluid level buffer 124. The sensor signal is then used for feedback control 130 to a valve 132 that is disposed in a recovery flow line 134 (which is connected to the fluid recovery outlet 58) connected between the porous member 51 and a collection tank 136. The valve 132 may be any suitable valve, such as a proportional or variable valve. The variable valve 132 is adjusted to control the fluid flow through the fluid recovery line 134 to the collection tank 136 to maintain the pressure or fluid level of the fluid level buffer 124 at a preset value. The collection tank 136 is under a relatively higher vacuum controlled by a high vacuum regulator 138 for fluid recovery. In this fluid control system 120, no overflow tank is needed and the collection tank 136 can be placed anywhere in the system and need not be disposed below an overflow tank. An on/off valve 140 is desirably provided in the fluid recovery line 134 and is switched off when fluid recovery is not required.

Figure 8:
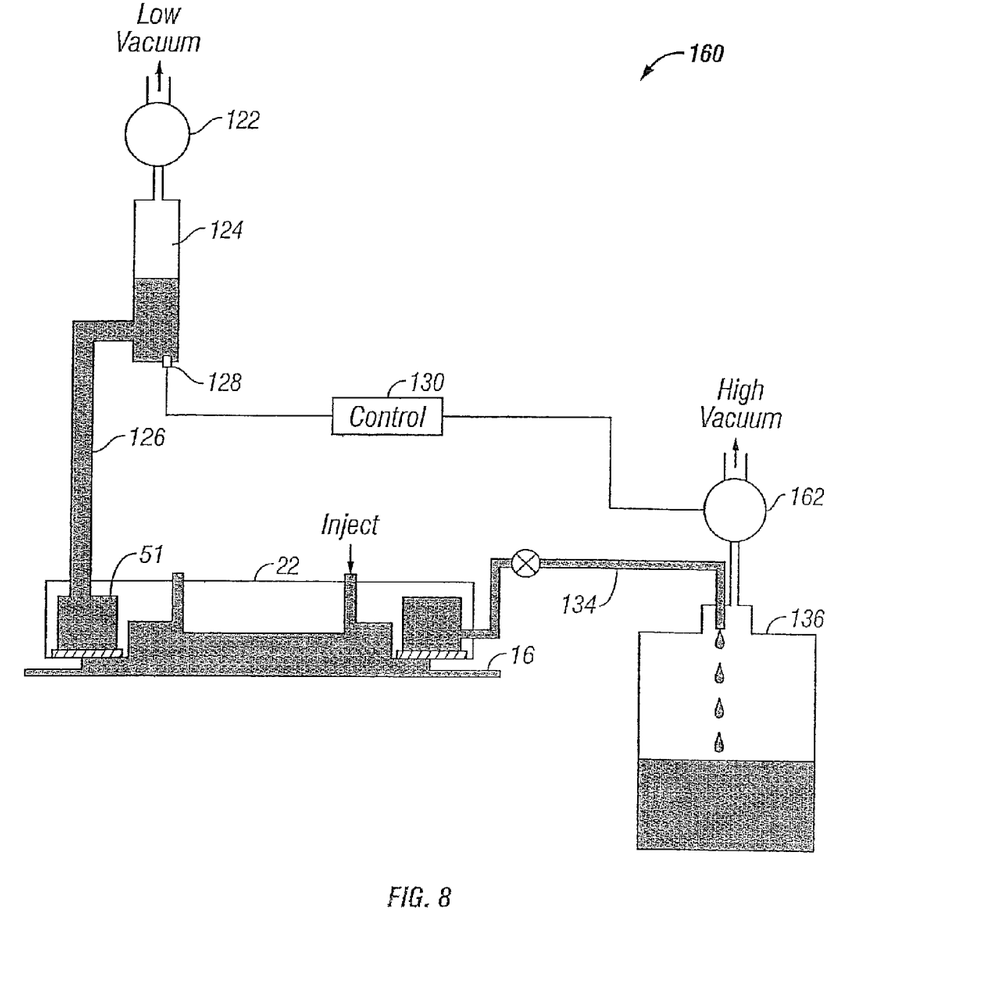
FIG. 8 is a simplified view schematically illustrating a pressure control system for fluid recovery in an immersion lithography system according to another embodiment of the invention.

In FIG. 8, the pressure control system 160 is similar to the system 120 of FIG. 7, and like reference characters are used for like parts. Instead of using the valve 132 for the feedback control of fluid recovery, this system 160 employs a controllable vacuum regulator 162 for the feedback control of fluid recovery. The vacuum regulator 162 is typically electronically controllable to adjust the vacuum pressure in the collection tank 136 based on the sensor signal from the pressure transducer or a water level sensor 128. The vacuum regulator 162 is adjusted to control the fluid flow through the fluid recovery line 134 to the collection tank 136 to maintain the pressure or fluid level of the fluid level buffer 124 at a preset value. The on/off valve 140 in the fluid recovery line 134 is switched off when fluid recovery is not required.

Figure 9:
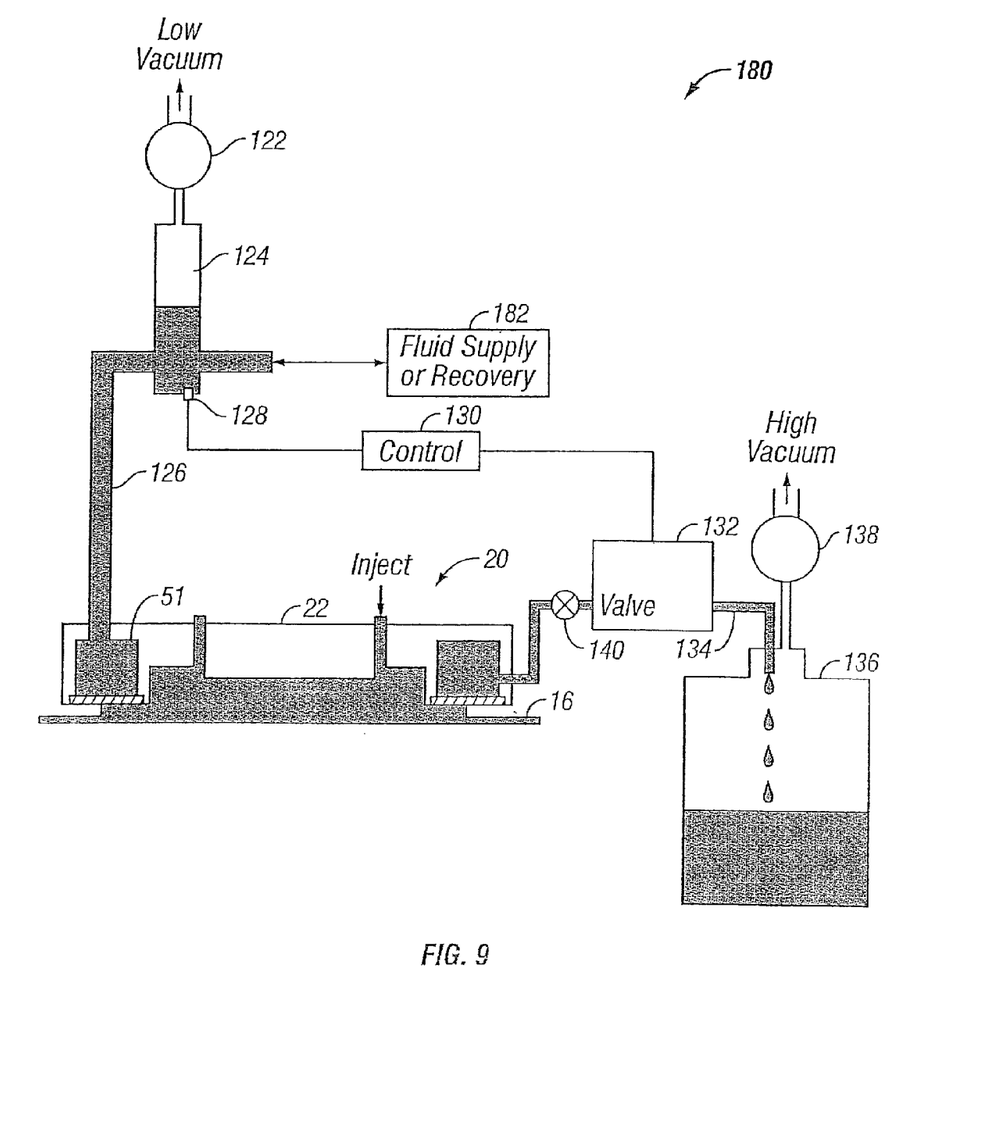
FIG. 9 is a simplified view schematically illustrating a pressure control system for fluid recovery in an immersion lithography system with water stagnation prevention according to another embodiment of the invention.

FIG. 9 shows a pressure control system for fluid recovery in an immersion lithography system with water stagnation prevention according to another embodiment of the invention. The pressure control system 180 is similar to the system 120 of FIG. 7 having the same components with the same reference characters. In addition, the fluid level buffer 124 is fluidically coupled with a fluid supply or fluid recovery 182 to supply fluid to or recover fluid from the fluid level buffer 124 to prevent stagnation. An optional pump or a similar moving part may be used to induce flow between the fluid level buffer 124 and the fluid supply or fluid recovery 182. There is a possibility of bacteria/fungus growth in stagnated water or fluid over time. Under normal operation, the water at the fluid level buffer 124 is stagnated because water recovered from the mesh 51 will go through the small tube at the mesh level to the collection tank 136. By inducing flow into or out of the fluid level buffer 124 during normal operation, the bacteria/fungus growth problem can be prevented.

It is to be understood that the above description is intended to be illustrative and not restrictive. Many embodiments will be apparent to those of skill in the art upon reviewing the above description. The scope of the invention should not be limited to the above description.

Also, the present invention could be applied to Twin-Stage-Type Lithography Systems. Twin-Stage-Type Lithography Systems, for example, are disclosed in U.S. Pat. No. 6,262,796 and U.S. Pat. No. 6,341,007, the disclosures of which are incorporated herein by reference in their entireties.

What is claimed is:

1. An immersion lithography system in which a substrate is exposed through a liquid, the system comprising:
a projection lens;
an immersion member under which the substrate is positioned, the immersion member is disposed around a final optical element of the projection lens, and the immersion member including a recovery opening for recovering liquid from an upper surface of the substrate; and
a pressure control system which controls a pressure for recovering the liquid from the upper surface of the substrate via the recovery opening, the pressure control system having a first tank connected to the recovery opening via a recovery flow line and a vacuum regulator to control a pressure in the first tank.

2. The system of claim 1, wherein the pressure control system has a flow regulator disposed in the recovery flow line, which adjusts a liquid flow from the recovery opening to the first tank.

3. The system of claim 2, wherein the flow regulator includes a valve.

4. The system of claim 1, wherein the pressure control system has a switching apparatus disposed in the recovery flow line, which closes the recovery flow line when the liquid recovery from the recovery opening is not required.

5. The system of claim 1, wherein the pressure control system has a valve disposed in the recovery flow line, the valve closing the recovery flow line when the liquid recovery from the recovery opening is not required.

6. The system of claim 1, wherein the recovery flow line is connected to an upper portion of the first tank.

7. The system of claim 1, wherein the vacuum regulator is connected to an upper portion of the first tank.

8. The system of claim 1, wherein the pressure control system has a pressure sensor to measure the pressure for recovering the liquid.

9. The system of claim 8, wherein the vacuum regulator is controlled based on a sensor signal from the pressure sensor.

10. The system of claim 1, wherein the pressure control system has a second tank connected to the first tank to flow the liquid from the first tank to the second tank.

11. The system of claim 10, wherein the second tank is disposed below the first tank.

12. The system of claim 10, wherein the pressure control system has a path connected between the first tank and the second tank.

13. The system of claim 12, wherein the path is configured to equalize a pressure between the first and second tanks.

14. The system of claim 12, wherein the path is connected between an upper portion of the first tank and an upper portion of the second tank.

15. The system of claim 1, wherein the liquid covers only a portion of the upper surface of the substrate during exposure of the substrate.

16. The system of claim 1, wherein the liquid is recovered through the recovery opening from the upper surface of the substrate, thereby the liquid covers only a portion of the upper surface of the substrate during exposure of the substrate.

17. An immersion lithography method comprising:
exposing a substrate through a liquid between a final optical element of a projection lens and the substrate;
recovering the liquid from an upper surface of the substrate via a recovery opening of an immersion member under which the substrate is positioned, the immersion member is disposed around the final optical element of the projection lens; and
controlling a pressure for recovering the liquid from the upper surface of the substrate via the recovery opening by a pressure control system, the pressure control system having a first tank connected to the recovery opening via a recovery flow line and a vacuum regulator to control a pressure in the first tank.

18. The method of claim 17, further comprising adjusting a liquid flow from the recovery opening to the first tank.

19. The method of claim 18, wherein the liquid flow is adjusted using a valve disposed in the recovery flow line.

20. The method of claim 17, further comprising closing the recovery flow line when the liquid recovery from the recovery opening is not required.

21. The method of claim 20, wherein the recovery flow line is closed using a valve disposed in the recovery flow line.

22. The method of claim 17, wherein the recovery flow line is connected to an upper portion of the first tank.

23. The method of claim 17, wherein the vacuum regulator is connected to an upper portion of the first tank.

24. The method of claim 17, further comprising measuring the pressure for recovering the liquid.

25. The method of claim 24, wherein the vacuum regulator is controlled based on the measured pressure.

26. The method of claim 25, wherein the pressure is measured by a pressure sensor of the pressure control system.

27. The method of claim 17, wherein the first tank is connected to a second tank to which the liquid flows from the first tank.

28. The method of claim 27, wherein the second tank is disposed below the first tank.

29. The method of claim 27, wherein the first tank is connected to the second tank to equalize a pressure between the first and second tanks.

30. The method of claim 17, wherein the liquid covers only a portion of the upper surface of the substrate during exposure of the substrate.

31. The system of claim 17, wherein the liquid is recovered through the recovery opening from the upper surface of the substrate, thereby the liquid covers only a portion of the upper surface of the substrate during exposure of the substrate.

* * * * *